(12) United States Patent
Roellgen

(10) Patent No.: US 7,911,197 B2
(45) Date of Patent: Mar. 22, 2011

(54) ARRANGEMENT FOR MEASURING THE CURRENT FLOWING IN AN ELECTRIC CONDUCTOR

(75) Inventor: Bernhard Roellgen, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/627,325

(22) Filed: Nov. 30, 2009

(65) Prior Publication Data

US 2010/0134093 A1    Jun. 3, 2010

Related U.S. Application Data

(63) Continuation of application No. PCT/EP2008/056594, filed on May 29, 2008.

(30) Foreign Application Priority Data

Jun. 1, 2007   (DE) .......................... 10 2007 025 505

(51) Int. Cl.
   *G01R 33/00*   (2006.01)

(52) U.S. Cl. ................ 324/117 H; 324/117 R

(58) Field of Classification Search .................. None
   See application file for complete search history.

(56) References Cited

U.S. PATENT DOCUMENTS

| | | | |
|---|---|---|---|
| 4,059,798 A * | 11/1977 | Dierker et al. | ................ 324/127 |
| 4,460,867 A * | 7/1984 | Fleissner | ................... 324/117 H |
| 4,656,418 A | 4/1987 | Boston et al. | |
| 6,411,078 B1 * | 6/2002 | Nakagawa et al. | ....... 324/117 H |
| 6,876,189 B2 | 4/2005 | Takatsuka et al. | |
| 7,332,903 B2 | 2/2008 | Hausperger et al. | |
| 7,541,799 B2 | 6/2009 | Hausperger et al. | |
| 7,579,825 B2 * | 8/2009 | Hausperger et al. | ...... 324/117 H |
| 7,622,909 B2 | 11/2009 | Teppan | |
| 2009/0295384 A1 | 12/2009 | Teppan | |

FOREIGN PATENT DOCUMENTS

| | | |
|---|---|---|
| DE | 10 2005 024 075 B4 | 11/2006 |
| DE | 10 2005 040 316 A1 | 3/2007 |
| EP | 1 450 166 A1 | 8/2004 |
| EP | 1 450 176 A1 | 8/2004 |

* cited by examiner

*Primary Examiner* — Minh N Tang
(74) *Attorney, Agent, or Firm* — Slater & Matsil, L.L.P.

(57) ABSTRACT

The invention relates to an arrangement for measurement of a current flowing in an electrical conductor having a magnetic circuit, for coupling to the electrical conductor, wherein the magnetic circuit has an air gap. A magnetic-field-sensitive component is located in the air gap in the magnetic circuit and is used to measure the magnetic field produced by the electrical conductor. Two control cores are arranged in the air gap in the magnetic circuit, wherein the control cores each have a control winding for magnetic saturation of the respective control core. The magnetic-field-sensitive component is arranged between the control cores and one or more additional elements are located in the vicinity of the magnetic-field-sensitive component, and are suitable for guidance of disturbing magnetic fields in the vicinity of the magnetic-field-sensitive component, independent of the control cores.

15 Claims, 2 Drawing Sheets

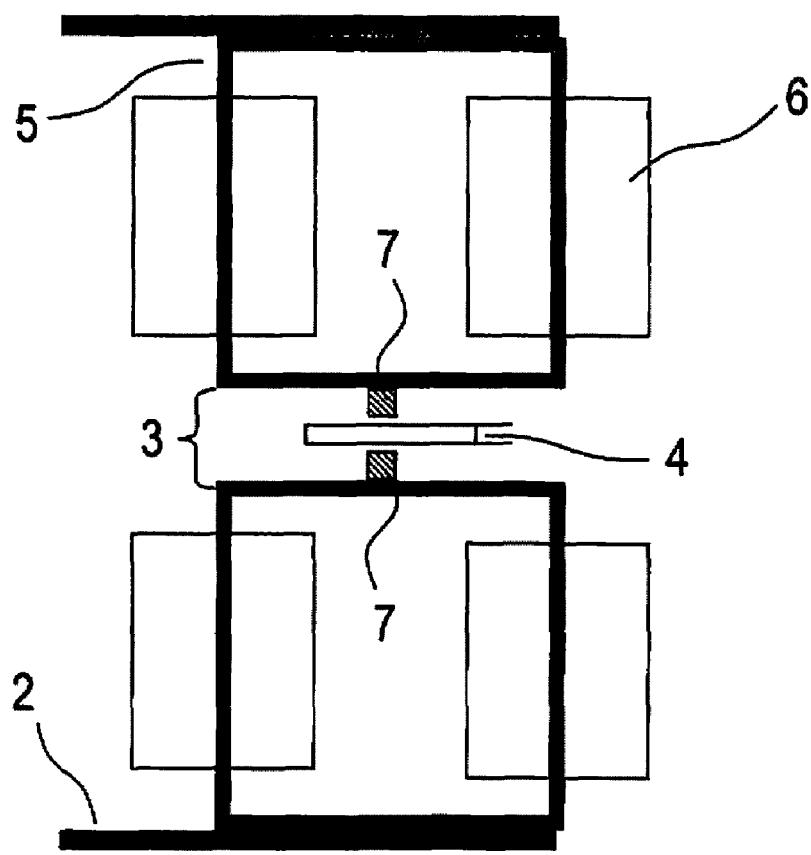

ARRANGEMENT FOR MEASURING THE CURRENT FLOWING IN AN ELECTRIC CONDUCTOR

This application is a continuation of co-pending International Application No. PCT/EP2008/056594, filed May 29, 2008, which designated the United States and was not published in English, and which claims priority to German Application No. 10 2007 025 505.7 filed Jun. 1, 2007, both of which applications are incorporated herein by reference.

BACKGROUND

The document DE 10 2005 024 075 B4, also published as U.S. Pat. No. 7,541,799, discloses an apparatus for measurement of a current flowing in an electrical conductor.

SUMMARY

In one aspect, the invention specifies an arrangement for measurement of a current flowing in an electrical conductor. This arrangement can allow a correct measurement independent of external magnetic influences.

The arrangement has a magnetic circuit, which is provided with an air gap, for coupling to an electrical conductor. A magnetic-field-sensitive component is arranged in the air gap in the magnetic circuit, in order to measure the magnetic field produced by the electrical conductor. Two control cores may be located in the air gap in the magnetic circuit and each have a control winding, which is used for saturation of the respective control core.

The magnetic-field-sensitive component is preferably located approximately in the center of the air gap of the magnetic circuit, by virtue of the arrangement of the magnetic-field-sensitive component between the control cores.

One or more additional elements are located in the vicinity of the magnetic-field-sensitive component and are suitable for guidance of magnetic fields in the vicinity of the measurement arrangement by means of the magnetic-field-sensitive component, independent of the control cores.

Magnetic fields in the vicinity of the magnetic-field-sensitive component, which are not caused by the electrical conductor or the control windings, can considerably deteriorate the measurement.

In a preferred embodiment, the additional element has magnetic characteristics in order to concentrate disturbing external magnetic fields on the magnetic-field-sensitive component.

The additional element preferably has a relative permeability greater than 1.

In particular, soft-magnetic materials are suitable for the additional element, which have a relative permeability which is greater than or equal to the relative permeability of the control cores. Materials which are also used for the control cores are preferably suitable for this purpose.

The additional element is preferably arranged on both sides of the magnetic-field-sensitive component, as a result of which possible magnetic disturbance fields can effectively be concentrated in the vicinity of the magnetic-field-sensitive component and can be guided through the magnetic-field-sensitive component.

In an embodiment, it is also possible for the element to be in the form of an integral component of an one-pieced control core. In this case, outward curvature on the control cores or a thickening of the control cores in the relatively near vicinity of the magnetic-field-sensitive component is possible, thus resulting in as small an air gap as possible between the additional elements and the magnetic-field-sensitive component. The area of the thickening or outward curvature of the control cores also still has a residual permeability when the control cores are saturated.

In a further embodiment, the element includes a plurality of individual parts, which can be joined together to form an element.

The additional element preferably has a residual permeability when the control windings completely saturate the control cores, such that disturbing magnetic fields are still concentrated by the additional element even when the control cores are saturated, and can be passed through the magnetic-field-sensitive component.

In one preferred embodiment, the additional element is composed of ferromagnetic material, for example, a ferrite, a nanocrystalline metal alloy or permalloy. However, other materials which have ferromagnetic characteristics are also suitable.

In order to allow a reliable measurement of the current flowing in the electrical conductor, the magnetic circuit is able to completely surround the cross section of the electrical conductor.

In a preferred embodiment, the control cores are in the form of ferrite cores. In this case, the ferrite cores are particularly preferably in the form of rectangular frames which, on at least one side of the frame, have a control winding for saturation of the ferrite core. In one particularly efficient embodiment, control windings are arranged on two opposite sides of the frame. Configuration of the control core in this form allows efficient saturation of the control core to be achieved.

In a further embodiment, the ferrite cores are in the form of rings which, in at least one area of the ring, have a control winding for saturation of the ferrite core. In a particularly efficient embodiment, control windings are arranged on two opposite areas of the ring in order to achieve efficient saturation of the control core.

In a preferred embodiment, the frames or rings of the respective control cores are aligned such that the planes which lie on the respective frames or rings preferably lie on a common plane. This arrangement, in which the two control cores lie on one plane, optimizes the overlap area of the control cores to a maximum. This minimizes the air gap in which the magnetic-field-sensitive component is arranged.

In a further embodiment, it is also possible for the control cores not to lie on a common plane but to be arranged rotated with respect to one another along an axis which passes through the two control cores and the magnetic-field-sensitive component.

The magnetic-field-sensitive component is preferably a Hall sensor. When a current flows through a Hall sensor that is positioned in a magnetic field running at right angles to the current, this results in an output voltage which is proportional to the product of the magnetic field strength and the current.

Various measurements are carried out with the aid of the Hall sensor in order to determine the current flowing in the electrical conductor. A first measurement is carried out with positively saturated control cores, and a further measurement is carried out shortly after the current flowing through the control windings is switched off. A further measurement is carried out with negatively saturated control cores, followed by a measurement shortly after the current through the control windings has been switched off. Taking account of specific factors which result from the sensitivity of the Hall sensor when control cores are saturated and unsaturated, the current level of the current flowing through the electrical conductor can be calculated from these four measurements using known equations.

Disturbing influences caused by external magnetic fields can be eliminated from the equations both for saturated control cores and for unsaturated control cores by means of the newly added elements composed of preferably soft-magnetic material, since these contributions can cancel one another out, by means of the additional elements.

The additional preferably soft-magnetic elements in the vicinity of the Hall sensor make it possible to cancel out the contributions of the external disturbing magnetic fields in the equations in order to calculate the current level, as a result of which these contributions can be eliminated. The contribution which is caused by disturbing external magnetic fields is thus cancelled out for calculation with unsaturated control cores and for calculation with saturated control cores, and can thus be eliminated from the equations. The linear equation system can therefore be solved in a simple manner, and the current level in the electrical conductor can be determined.

The following two equations are used in this case:

$$R_L = n + s_l * I + s_{Bl} * B_{static} * \sin(\alpha)$$

$$R_H = n + S_h * I + S_{Bh} * B_{static} * \sin(\alpha)$$

Physical variables are often converted to analogous electrical variables in the measurement. When the measurement range of the analogous variable is quantized to a finite number, mutually adjacent sub areas (intervals) are subdivided, and each of them is allocated a value in a finite symbolic system (for example, an integer). The number of sub areas of the analogous variable that are used, and also in the case of binary symbolic systems their powers of two (resolution in bits), are referred to as the resolution, although this is also the size of the intervals when the intervals are of the same size.

The quantization steps reflect the value for the measurement signal in discrete form.

In the equations quoted above, $R_L$, indicates the number of quantization steps for the measurement with low sensitivity, and $R_H$ indicates the number for high sensitivity. The variable n indicates the zero point of the magnetic-field-sensitive component in the quantization steps. The variables $s_l$ and $s_h$ indicate the sensitivity of the magnetic-field-sensitive element for saturated control cores ($s_l$) and for unsaturated control cores ($s_h$). The variable $B_{static}$ denotes the magnetic flux density of an external magnetic field, and the variable a indicates the angle from which the external magnetic field enters the magnetic-field-sensitive component. The variable I indicates the current level of the current flowing through the conductor which is intended to be determined in the measurement.

The additional preferably soft-magnetic elements in the vicinity of the magnetic-field-sensitive component now make it possible to cancel out the variables $s_{Bl}$ and $s_{Bh}$. The linear equation system can therefore be solved in a simple manner, in order to determine the current level I.

The arrangement will be explained in more detail in the following text with reference to exemplary embodiments and the associated figures.

BRIEF DESCRIPTION OF THE DRAWINGS

The drawings which will be described in the following text should not be regarded as true to scale. In fact, individual dimensions may be illustrated in an increased, decreased or else distorted form, in order to improve the illustration.

Elements which are the same as one another or carry out the same function are annotated with the same reference symbols.

FIG. 3 shows a detail of a further example of an arrangement for measurement of a current flowing in an electrical conductor.

Figure 1:
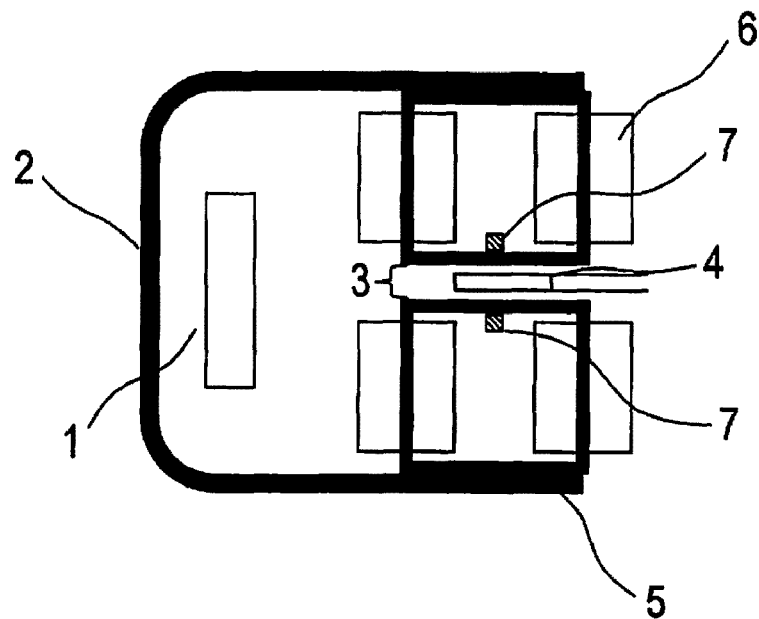
FIG. 1 shows an example of an arrangement for measurement of a current flowing in an electrical conductor.

The following list of reference symbols may be used in conjunction with the drawings:

1 Electrical conductor
2 Magnetic circuit
3 Air gap
4 Magnetic-field-sensitive component
5 Control core
6 Control winding
7 Additional element

DETAILED DESCRIPTION OF ILLUSTRATIVE EMBODIMENTS

FIG. 1 shows a possible embodiment of an arrangement for measurement of a current flowing in an electrical conductor, in which a magnetic circuit 2 surrounds an electrical conductor 1, which circuit may be composed of ferrite. On one side, the magnetic circuit 2 has an air gap 3 in which two control cores 5 are located. A magnetic-field-sensitive component 4 is located between the control cores 5 and is used to measure the current flowing in the electrical conductor 1. The control cores 5 each have control windings 6, which are used for saturation of the control cores 5. These control windings 6 are preferably located on one or more sides, preferably on opposite sides, of the frame of the control core 5.

In a further embodiment, the control cores 5 may also be rings, which are not illustrated here. These rings have control windings 6 in one or more areas, which control windings 6 are preferably arranged in opposite areas.

In order to preclude disturbances in the measurement of the current flowing through the electrical conductor 1, or to calculate them out when determining the required measured values, further elements 7, which concentrate disturbing magnetic fields and pass through the magnetic-field-sensitive component 4, are located in the vicinity of the magnetic-field-sensitive component 4.

In a preferred embodiment, soft-magnetic materials are preferably suitable for these elements 7. These elements 7 may be formed both separately or else as a sub area of the control core. It is also possible for the elements 7 to be assembled from a plurality of individual parts. In a preferred embodiment, the elements 7 form a part of the control core 5. In this case, outward bulges or thickened areas of the control core 5 in the vicinity of the magnetic-field-sensitive component 4 are particularly suitable.

As in the preferred embodiment, these elements 7 may be composed of the same material as the control cores 5. In a further embodiment, however, the elements 7 may also be formed from any desired material which has soft-magnetic characteristics. The shape of the element 7 in this case has no influence on the influence which the element 7 exerts on disturbing magnetic fields.

By way of example, the element 7 may be in the form of a square, in the form of a ring, in the form of an octahedron, in the form of a dodecahedron, or may have any other desired shape.

Figure 2:
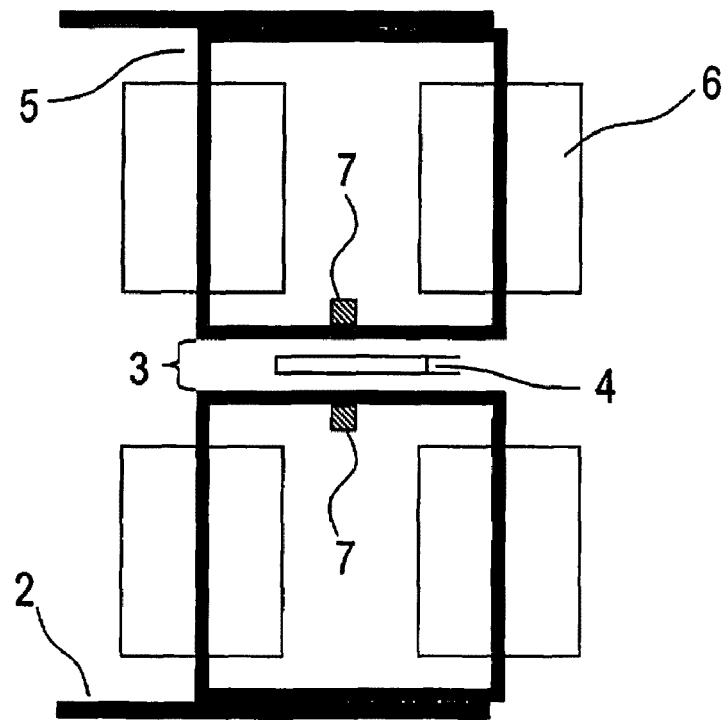
FIG. 2 shows a detail of an example of an arrangement for measurement of a current flowing in an electrical conductor.

FIG. 2 and FIG. 3 show a detail from FIG. 1, which is intended to illustrate in more detail the position of the elements 7 in the area of the magnetic-field-sensitive component 4. The exact position of the element 7 is not of major importance, and all that is necessary is to ensure that the element 7 is arranged in the vicinity of the magnetic-field-sensitive component 4 in order that disturbing magnetic fields can be concentrated in the vicinity of the measurement arrangement, and can be passed through the magnetic-field-sensitive component 4.

Although it has been possible to describe only a restricted number of possible developments of the invention in the exemplary embodiments, the invention is not restricted to them. In principle, it is possible to use a different number of control windings, a different shape of the magnetic circuit for the arrangement, or to arrange the elements in an offset position with respect to one another. The invention is not restricted to the number of schematically illustrated elements.

The description of the subjects and methods specified here is not restricted to the individual specific embodiments. In fact, the features of the individual embodiments can be combined with one another as required, where this is technically worthwhile.

What is claimed is:

1. An arrangement for measurement of a current flowing in an electrical conductor, the arrangement comprising:
   a magnetic circuit with an air gap for coupling to the electrical conductor;
   two control cores for controlling the air gap, the control cores being arranged in the air gap, wherein the control cores each have a control winding for magnetic saturation of the respective control core;
   a magnetic-field-sensitive component arranged in the air gap between the control cores in order to measure the magnetic field produced by the electrical conductor; and
   one or more additional elements located in the vicinity of the magnetic-field-sensitive component and suitable for guidance of magnetic fields in the vicinity of the magnetic-field-sensitive component independent of the control cores.

2. The arrangement as claimed in claim 1, wherein the additional elements can be magnetized.

3. The arrangement as claimed in claim 1, wherein the additional elements are composed of a soft-magnetic material.

4. The arrangement as claimed in claim 1, wherein the additional elements have a relative permeability that is greater than or equal to a relative permeability of the control cores.

5. The arrangement as claimed in claim 1, wherein the additional elements are arranged on both sides of the magnetic-field-sensitive component.

6. The arrangement as claimed in claim 1, wherein the additional elements have a residual permeability when the control cores are saturated.

7. The arrangement as claimed in claim 1, wherein the additional elements contain ferromagnetic metals.

8. The arrangement as claimed in claim 1, wherein the magnetic circuit surrounds the electrical conductor.

9. The arrangement as claimed in claim 1, wherein the control cores comprise ferrite cores.

10. The arrangement as claimed in claim 9, wherein the control cores have a rectangular frame and, on at least one side of the frame, have a control winding for saturation of the control core.

11. The arrangement as claimed in claim 9, wherein each control core is in the form of a ring and, in a sub area of the ring, have a control winding for saturation of the control core.

12. The arrangement as claimed in claim 1, wherein the control cores have a control winding on two opposite sides.

13. The arrangement as claimed in claim 1, wherein the control cores lie on a common plane.

14. The arrangement as claimed in claim 1, wherein the control cores are arranged rotated with respect to one another.

15. The arrangement as claimed in claim 1, wherein the magnetic-field-sensitive component comprises a Hall sensor.

* * * * *